United States Patent [19]

Matsui et al.

[11] Patent Number: 5,351,081
[45] Date of Patent: Sep. 27, 1994

[54] SOLID-STATE IMAGING DEVICE HAVING A LIGHT BARRIER LAYER

[75] Inventors: Hiromichi Matsui; Kazuomi Ezoe, both of Kanagawa; Toshiro Kurusu, Kagoshima, all of Japan

[73] Assignee: Sony Corporation, Tokyo, Japan

[21] Appl. No.: 173,955

[22] Filed: Dec. 23, 1993

Related U.S. Application Data

[63] Continuation of Ser. No. 788,169, Nov. 5, 1991, abandoned.

[30] Foreign Application Priority Data

Nov. 16, 1990 [JP] Japan ................... 2-308513

[51] Int. Cl.$^5$ .............................................. H04N 3/14
[52] U.S. Cl. ................................... 348/249; 348/311; 257/232
[58] Field of Search ............... 348/248, 249, 241, 311; 257/232, 242, 249

[56] References Cited

U.S. PATENT DOCUMENTS

| | | | |
|---|---|---|---|
| 4,689,687 | 8/1987 | Koike et al. | 358/213.24 |
| 4,949,143 | 8/1990 | Iesaka et al. | 358/213.23 |

FOREIGN PATENT DOCUMENTS

| | | | |
|---|---|---|---|
| 58-142682 | 8/1983 | Japan | 358/213.24 |
| 1008664 | 1/1989 | Japan | 358/213.24 |
| 1015969 | 1/1989 | Japan | 358/213.24 |
| 64-169465 | 6/1989 | Japan | 358/213.24 |
| 1280354 | 11/1989 | Japan | 358/213.24 |
| 2014570 | 1/1990 | Japan | 358/213.24 |
| 2304976 | 12/1990 | Japan | 358/213.24 |
| 3161970 | 7/1991 | Japan | 358/213.24 |

*Primary Examiner*—Joseph Mancuso
*Assistant Examiner*—Wendy R. Greening
*Attorney, Agent, or Firm*—Hill, Steadman & Simpson

[57] ABSTRACT

A solid-state imaging device in which a light-barrier layer is formed on transfer electrodes on top of a vertical pixel isolating region by an insulating film. The light-barrier layer is adapted to overlie the lateral sides of the transfer electrodes and the peripheral region of a photosensor region neighboring on the vertical pixel isolating region. By provision of the light-barrier layer, the light incident on the vertical pixel isolating region is stopped to reduce smear charges which might otherwise be intruded into the vertical charge transfer section.

4 Claims, 3 Drawing Sheets

SOLID-STATE IMAGING DEVICE HAVING A LIGHT BARRIER LAYER

This is a continuation, of application Ser. No. 07/788,169, filed Nov. 5, 1991, now abandoned.

BACKGROUND OF THE INVENTION

1. Field of the Invention

This invention relates to a CCD type solid-state imaging device in which signal charges are transferred by means of transfer electrodes. More particularly, it relates to an interline transfer or frame interline transfer type solid-state imaging device.

2. Description of the Related Art

A CCD image sensor usually has a plurality of photosensor regions arrayed on the surface of a silicon substrate, and is so constructed that signal charges generated in these regions are transferred out of a chip to produce image signals.

This type of the CCD image sensor known in the art is constructed as shown in FIG. 1, in which a plurality of photosensor regions 2 consisting of n-type impurity-diffusion regions are formed on the surface of a p-type silicon substrate 1. Signal charges are generated in each of the these photosensor regions 2 isolated from the photosensor regions 2 neighboring thereon in the vertical direction or in a direction shown by an arrow V in FIG. 1. On top of a region isolating the neighboring photosensor regions 2 from each other are formed a first transfer electrode layer 4 and a second electrode layer 5, with interposition of an insulating layer 3, for establishing connection with neighboring vertical charge transfer sections. On top of the second transfer electrode 5 is formed an aluminum light-barrier layer 7 with interposition of a second insulating layer 6. This light-barrier layer 7 is formed for surrounding a region around the photosensor region 2 and an aperture 8 formed in the light-barrier layer 7 faces the photosensor region, With this type of the CCD image sensor, the light incident via aperture 1 is converted in the photosensor region 2 into signal charges which are transferred and outputted as image signals.

The above described conventional CCD image sensor, however, has a drawback that low smear cannot be realized due to electrical charges from a vertical pixel isolation region 9.

That is, some of the incident light through aperture 1 is incident obliquely to generate signal charges in the vertical pixel isolating region 9. The charges thus generated in the vertical pixel isolating region 9 descend down the hill of potential towards the vertical charge transfer section 10 to flow into the vertical charge transfer section 10, thus producing smear to lower the quality of the video signals, In the JP Patent Publication KOKAI No. 62-221147 (1987), there is disclosed a technique wherein the light-barrier layer is formed up to the lateral side of a step region to reduce the smear. However, charge generation in the vertical pixel isolating region cannot be suppressed sufficiently by simply covering the step region with the light-barrier layer,

OBJECT AND SUMMARY OF THE INVENTION

It is an object of the present invention to provide a solid-state imaging device wherein smear due to charges generated in the vertical pixel isolating region may be reduced.

The present invention provides a solid-state imaging device in which a light-barrier layer is formed on top of transfer electrodes on a vertical pixel isolating region by means of an insulating layer, and in which the light-barrier layer is adapted to cover the lateral sides of the transfer electrodes and peripheral regions of the photosensor regions neighboring on the vertical pixel isolating region.

With the present solid-state imaging device, the light-barrier layer is adapted to cover not only the lateral sides of the transfer electrodes but also the peripheral regions of the photosensor regions neighboring on the vertical pixel isolating region. Thus the light falling on the vertical pixel isolating region is stopped to reduce smear charges which might otherwise flow into the vertical charge transfer section,

DETAILED DESCRIPTION OF THE PREFERRED EMBODIMENT

Figure 1:
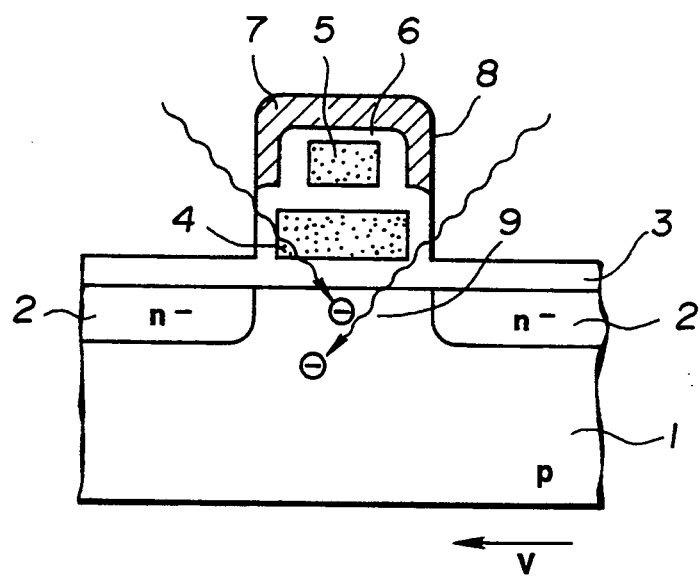
FIG. 1 is a cross-sectional view showing essential parts of a conventional solid-state imaging device.

Referring to the drawings, a CCD image sensor as a solid-state imaging device according to the present invention is hereinafter explained.

Figure 3:
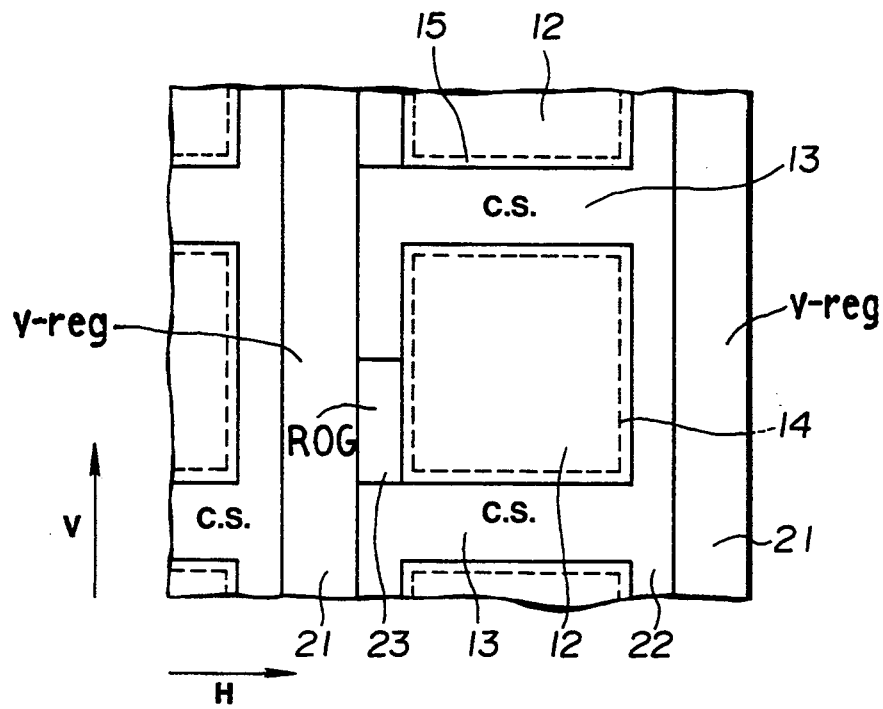
FIG. 3 is a partial schematic view showing the layout on a substrate surface of a CCD image sensor according to the present invention.
Figure 6:
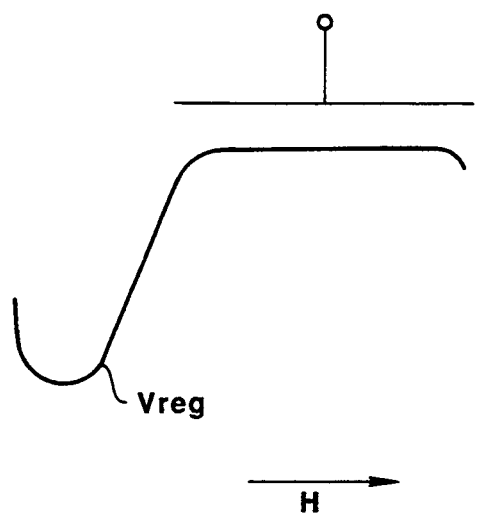
FIG. 6 is a graph showing the potential in the vertical pixel isolating region in the CCD image sensor shown in FIG. 3.

Referring to FIG. 3, the CCD image sensor according to the present invention includes a plurality of photosensor regions 12 comprised of n-type impurity-diffusion regions arranged on a p-type si 1 icon substrate in a matrix configuration, Each photosensor region 12 has a substantially square plan configuration. A vertical charge transfer section 21 is provided adjacent to each vertical column of the photosensor regions. A plurality of such vertical charge transfer sections are provided in alternation with the columns of the photosensors in the horizontal direction shown by an arrow H in FIG. 3. This vertical charge transfer section 21 is adapted for transferring charges in the vertical direction shown by an arrow V in FIG. 3. Each vertical charge transfer section 21 is electrically connected to the photosensor regions 12 by means of readout gates (ROGs) 23 provided between it and the photosensor regions 12. Each photosensor region 12 is surrounded by a channel stop region 22 except at the readout gate 23. The vertical pixel isolating region 13 between the vertically adjoining photosensor regions 12, 12 also forms a part of the channel stop region 22. Charge generation at the vertical pixel isolating region 13 is prevented as a result of the construction of the light-barrier layer 14 which will be explained subsequently.

Figure 4:
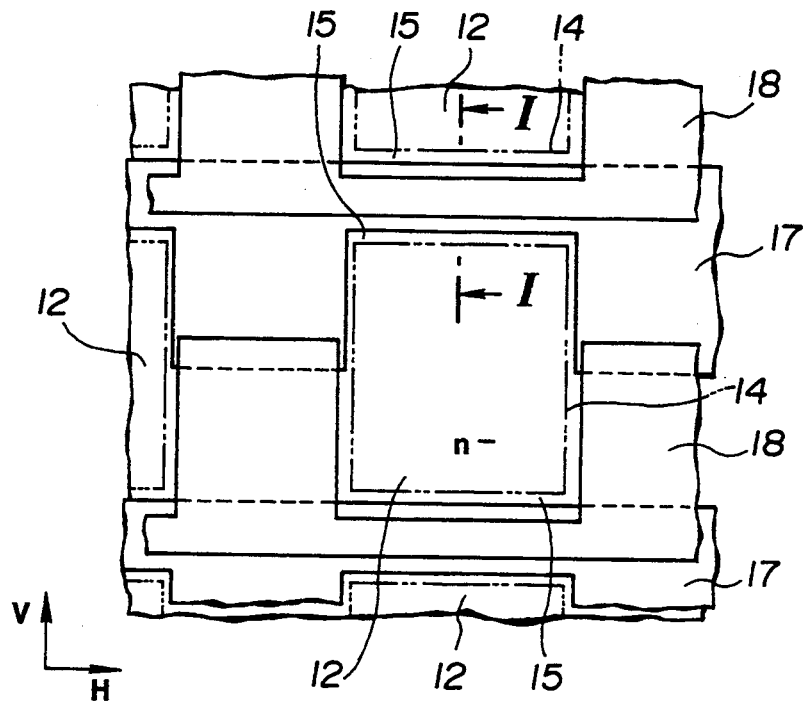
FIG. 4 is a partial plan view of the CCD image sensor shown in FIG. 3.

On top of the vertical charge transfer section 21 are formed two transfer electrode layers 17, 18 for supplying driving signals for transferring charges in the vertical direction. The first transfer electrode layer 17 is formed of polysilicon and arranged on an insulating layer 16 formed on the silicon substrate 11. As shown in FIG. 4, the first transfer electrode layer has a length in the vertical direction equal to one half the pixel length and has a pattern of covering an area between the photosensor regions 12, 12 facing each other with the vertical charge transfer section 21 in-between. This first transfer electrode layer 17 interconnects the vertical charge transfer sections 21 on top of the vertical pixel isolating region 13 with a pattern commensurate with or finer than the gap between the photosensor regions 12, 12 facing each other in the V direction. A second transfer electrode layer 18 is partially superimposed on the first transfer electrode layer 17 by means of an insulating layer 19, while being also formed on a silicon substrate 1 1 by means of the insulating layer 16. This second transfer electrode layer 18 is similarly formed of polysilicon. The second transfer electrode 18 is of such a pattern in which it is of the same width as the first transfer electrode layer 17 in the H direction on top of the vertical charge transfer section 21 and has its both ends in the V direction superimposed on the ends of the first transfer electrode layer 17. Meanwhile, on top of the vertical pixel isolating region 13, the second transfer electrode layer 18 is of a pattern finer than the first transfer electrode layer 17 for interconnecting the electrodes on each vertical charge transfer section 21.

Figure 5:
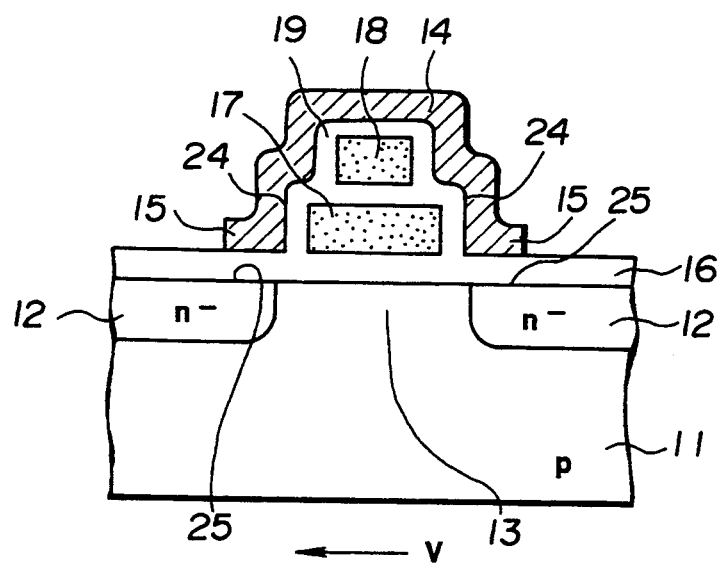
FIG. 5 is a cross-sectional view taken along line I—I of FIG. 4.

Both of the first and the second transfer electrode layers 17 and 18, having the above described patterns, are coated by the insulating layer 19. Referring to FIG. 5, a light-barrier layer 14 of aluminum is formed on the insulating layer 19. The light-barrier layer 14 is formed over the top and lateral sides 24 of the first and second transfer electrode layers 17 and 18 as far as a peripheral regions 25 of the photosensor regions 12. Above all, on the substrate major surface, the light-barrier layer 14 overlies the peripheral region 25 of the photosensor region 12 by a skirt portion 15 projecting from the lateral surface 24. With the skirt portion 15 partially projecting on the photosensor region 12 as the charge storage section, the light about to be incident on the vertical pixel isolating region 13 is stopped by the skirt portion 15 for thereby suppressing generation of electrical charges in the vertical pixel isolating region 13. The size of the skirt portion may be set depending on the amount of smear charges to be reduced and thus may be arbitrarily set in a range size from a size extending only slightly on the photosensor region 12 to a size substantially covering the peripheral region 25 of the photosensor region 12 to a larger extent.

Figure 2:
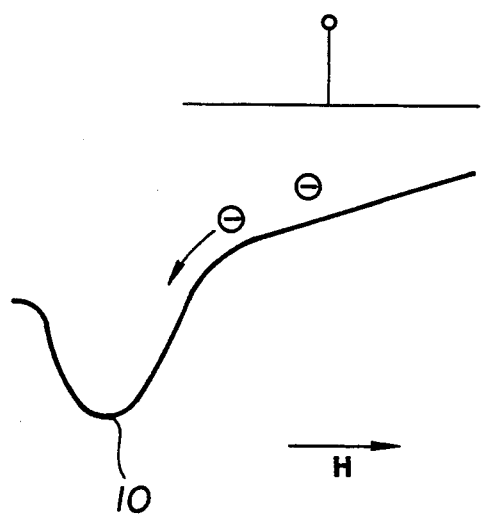
FIG. 2 is a graph showing a potential of a vertical pixel isolating region of the imaging device shown in FIG. 1.

Meanwhile, smear charges which might cause deterioration of image signals are caused to flow in accordance with a potential from the vertical pixel isolating region 13 to the vertical charge transfer section 21, as already explained by referring to FIG. 2. At this time, the transfer electrodes 17, 18 on the vertical pixel isolating region 13 function as gate electrodes of a simulated MOS transistor. Thus, for reducing smear, the threshold voltage Vth of the MOS transistor is enhanced to prevent the hill of potential of the vertical pixel isolating region from being shifted readily to a lower value towards the vertical charge transfer section $V_{reg}$. Specifically, the impurity concentration of the vertical pixel isolating region 13 is adjusted to prevent a channel from being formed in the vertical pixel isolating region 13 when driving signals are supplied to the first transfer electrode layer 17. By such enhancement, charges may be prevented from flowing from the vertical pixel isolating region 13 into the vertical charge transfer section Vreg for realizing low smear.

What is claimed is:
1. A CCD comprising:
   a plurality of pixels arrayed in a plurality of vertical columns,
   a plurality of vertical transfer sections arrayed parallel to said columns of pixels and completely covered with a light-barrier layer,
   a plurality of vertical pixel isolating regions adapted for vertically isolating said pixels from one another, by means of a potential barrier formed in a semiconductor substrate and a light-barrier layer, and said vertical pixel isolating regions each having a down slope of potential in the direction of said transfer section and arrayed between rows of said pixels, wherein said light-barrier layer completely covers the whole of said vertical pixel isolating region.

2. The CCD according to claim 1 wherein a vertical transfer electrode of said vertical transfer section is comprised of two polysilicon electrodes.

3. The CCD according to claim 1 wherein said light-barrier layer is comprised of an aluminum layer.

4. The CCD according to claim 1 wherein impurity concentration of said vertical pixel isolating region is adjusted to prevent a channel from being formed in said vertical pixel isolating region when a driving current is supplied to a transfer electrode on top of the vertical pixel isolating region.

* * * * *